United States Patent [19]

Schlosser

[11] Patent Number: 4,937,169

[45] Date of Patent: Jun. 26, 1990

[54] LIGHT-SENSITIVE PRINTING PLATE FOR WATERLESS PLANOGRAPHIC PRINTING WITH INNER AND OUTER LAYER OF SILICONE RUBBER WHEREIN OUTER LAYER HAS HIGHER DEGREE OF CROSSLINKING THAN INNER LAYER

[75] Inventor: Hans-Joachim Schlosser, Wiesbaden, Fed. Rep. of Germany

[73] Assignee: Hoechst Aktiengesellschaft, Frankfurt am Main, Fed. Rep. of Germany

[21] Appl. No.: 244,479

[22] Filed: Sep. 15, 1988

[30] Foreign Application Priority Data

Sep. 18, 1987 [DE] Fed. Rep. of Germany ....... 3731438

[51] Int. Cl.$^5$ ...................... G03C 1/60; G03C 1/495; G03C 1/68; G03C 1/71
[52] U.S. Cl. .................................. 430/162; 430/166; 430/167; 430/271; 430/272; 430/303
[58] Field of Search ............... 430/162, 166, 167, 271, 430/272, 303

[56] References Cited

U.S. PATENT DOCUMENTS

| | | | |
|---|---|---|---|
| 3,849,359 | 11/1974 | Nitzsche et al. | 428/447 |
| 4,184,006 | 1/1980 | Hockemeyer et al. | 428/447 |
| 4,358,522 | 11/1982 | Fujita et al. | 430/166 |
| 4,690,886 | 9/1987 | Naritomi et al. | 430/303 |
| 4,775,607 | 10/1988 | Schlosser | 430/162 |
| 4,826,752 | 5/1989 | Yoshida et al. | 430/162 |

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A light-sensitive printing plate for waterless planographic printing is disclosed comprising a support, a superimposed light-sensitive layer, an outer, ink-repellent silicone rubber layer, and an inner, ink-repellent silicone layer between the light-sensitive layer and the outer silicone rubber layer, the outer silicone rubber layer having a higher degree of crosslinking than the inner layer. The printing plate is less sensitive to scratching and, at the same time, shows good developability and image resolution.

11 Claims, No Drawings

LIGHT-SENSITIVE PRINTING PLATE FOR WATERLESS PLANOGRAPHIC PRINTING WITH INNER AND OUTER LAYER OF SILICONE RUBBER WHEREIN OUTER LAYER HAS HIGHER DEGREE OF CROSSLINKING THAN INNER LAYER

BACKGROUND OF THE INVENTION

The present invention relates to a light-sensitive printing plate comprising a support, a light-sensitive layer and a superimposed ink-repellent layer of a silicone elastomer.

Printing plates of this type are known, for example, from German Offenlegungsschrift 16 71 637. The light-sensitive layers used therein are preferably those based on polycondensation products of aromatic diazonium salts and formaldehyde. By exposure, these layers become insoluble in the developer and can be developed with aqueous solutions. During development, those areas of the silicone elastomer layer which are located above the soluble, unhardened areas of the light-sensitive layer are removed together with these soluble areas, even though they are insoluble in the developer. It is necessary, however, to add sufficient quantities of organic solvents to the developer, so that the silicone elastomer exposed to the developer becomes swollen and thus softened. For example, mixtures of isopropanol and water are used for development.

The silicone elastomers used for this purpose are single-component elastomers which require moisture and a considerable length of time in order to harden after application of the layer. Such single-component silicone elastomers are usually polysiloxanes, for example dimethylpolysiloxanes which contain terminal acetyl, oxime, hydroxyl or amino groups.

German Offenlegungsschrift 23 23 972 discloses a similar plate with a single-component silicone elastomer, wherein the light-sensitive layer contains a reaction product, obtained from a diphenylamine-4diazonium salt/formaldehyde condensation product and 2-hydroxy-4-methoxy-benzophenone-5-sulfonic acid, and, if appropriate, a binder. Since the solubility of the diazonium salt precipitation product is very low, both the preparation and the development of the plate are difficult.

In German Offenlegungsschrift 23 57 871, presensitized plates for waterless offset printing are described which contain a multi-component silicone elastomer layer. In addition to organopolysiloxanes, these layers contain, for example, low-molecular weight silanes which are capable of reacting with functional end groups of the polysiloxanes with crosslinking in the absence of moisture. These multi-component systems can crosslink by means of addition reactions or condensation reactions. In the addition type, as described in the above-mentioned German Offenlegungsschrift, for example, terminal alkenyl groups react with Si-H groups in the presence of catalysts at an elevated temperature.

The addition type yields plates that are highly ink-repellent and readily developable. However, the layers are frequently sensitive to scratching so that, upon handling a plate in the printing machine, scratches occur on the silicone surface. These scratches appear in the impression and thus render the printing plate useless. In the condensation-crosslinking systems, terminal functional groups of polydiorganosiloxanes react with functional groups of silanes or oligosiloxanes which act as crosslinking agents, in most cases in the presence of catalysts.

The printing plates obtained with these silicone rubber layers show good ink repellency in the non-image areas and, as a result of a high crosslinking density, excellent scratch resistance of the ink-repellent silicone layer. However, printing plates provided with layers of this kind are very difficult to develop and resolution of the image elements is insufficient.

According to German Offenlegungsschrift 29 41 254, a so-called primer is applied in a thin layer between the light-sensitive layer and silicone rubber layer, in order to improve the adhesion between these layers. The silicone primers or silicone coupling agents mentioned include, for example, alkyl, aminoalkyl and alkoxy silanes.

These substances merely serve to enhance the adhesion of the silicone rubber to the light-sensitive layer.

SUMMARY OF THE INVENTION

It is therefore an object of the present invention to provide a planographic plate, in particular an offset plate, for waterless printing, having a highly scratch-resistant surface and capable of being developed within a short period of time with high image resolution.

According to the invention these and other objects are provided by a light-sensitive printing plate for waterless lithographic printing, comprising a support, a superimposed light-sensitive layer and an ink-repellent silicone rubber layer overlying the light-sensitive layer comprising an inner layer and an outer layer, the outer layer having a higher degree of crosslinking than the inner layer.

The invention also provides a process for preparing a light-sensitive printing plate for waterless planographic printing, comprising the steps of applying a light-sensitive layer to a support, coating the light-sensitive layer with a solution of an addition-crosslinkable multi-component silicone elastomer or a single-component silicone elastomer, drying and partially crosslinking the elastomer layer at an elevated temperature, coating the dried and at least partially crosslinked silicone elastomer layer with a solution of a condensation-crosslinkable multi-component silicone elastomer, and drying at an elevated temperature to complete crosslinking.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Within the scope of this invention "silicone elastomer" is to be understood, in accordance with the definition by Noll, "Chemie und Technologie der Silikone (Chemistry and Technology of Silicones)," *Verlag Chemie*, 1968, page 332, as a high-molecular weight, substantially linear diorganopolysiloxane, whereas the term "silicone rubber" is used for the crosslinked or vulcanized products.

According to the present invention the outer silicone rubber layer has a higher degree of crosslinking than the inner silicone rubber layer. Upon development, this strongly crosslinked layer, unexpectedly, exactly follows the contours of the image elements of the underlying light-sensitive layer. A printing plate according to the invention comprising the above-defined double silicone rubber layer therefore shows a higher image resolution than a corresponding plate comprising only a strongly crosslinked silicone rubber layer and having no less strongly crosslinked inner silicone rubber layer.

It is basically possible to achieve the different degrees of crosslinking and thus of hardening of the silicone layers using any type of silicone elastomers in the inner and outer layers, even those that are mutually identical by selecting appropriate crosslinking agents and/or cross-linking conditions. It is, however, advantageous to use different silicone elastomers. In this case, single-component silicone elastomers or addition-crosslinkable multi-component silicone elastomers are preferably used for the inner layer that has to be less strongly crosslinked, while condensation-crosslinkable multi-component silicone elastomers are used for the outer layer that has to be crosslinked to a higher degree.

The single-component silicone elastomers are normally based on polysiloxanes containing, for example, terminal acetyl, oxime, alkoxy or amino groups or hydrogen atoms. The remainder of the polysiloxane consists essentially of a dimethylpolysiloxane chain. To a relatively minor extent, the methyl groups can also be replaced by other alkyl groups, by halogenoalkyl groups or by substituted or unsubstituted aryl groups. The terminal functional groups are easily hydrolyzable and harden under the action of moisture within a period ranging from a few minutes to several hours.

The addition-crosslinkable multi-component silicone elastomers contain, in general, polysiloxanes with alkenyl groups as substituents and those with hydrogen atoms bonded to silicon. They are crosslinked at temperatures above 50° C. in the presence of platinum catalysts. They have the advantage that they crosslink rapidly at an elevated temperature of, for example, about 100° C. On the other hand, the processing period (pot life) of these systems can be relatively short. Systems of this kind are described, for example, in German Offenlegungsschrift 26 54 893. They comprise addition-crosslinkable multi-component silicone elastomers of
- (a) diorganopolysiloxanes having terminal Si-vinyl groups,
- (b) organopolysiloxanes containing at least three hydrogen atoms bonded to silicon,
- (c) platinum complexes of vinyl siloxanes, and
- (d) an agent that retards the addition of hydrogen atoms bonded to silicon to aliphatic multiple bonds at room temperature.

The addition-crosslinking elastomers yield good adhesion and high printing stability, but they often have a higher sensitivity to scratching.

The mixtures crosslinkable by condensation contain diorganopolysiloxanes with reactive end groups, for example OH groups and acetoxy groups. These are crosslinked with reactive silanes or oligosiloxanes in the presence of catalysts. These combinations also react relatively rapidly and therefore have a limited pot life.

Multi-component silicone elastomers which are crosslinkable by condensation, such as are described in German Patent 21 19 120 are particularly advantageous.

These preferred silicone elastomers are combinations, crosslinkable by condensation, of (a) diorganopolysiloxanes with terminal Si-OH groups, (b) organopolysiloxanes that contain hydrogen atoms bonded to silicon, but no amino groups, (c) amino-substituted organo-silicon compounds and (d) organo-tin compounds acting catalytically.

These silicone elastomers have a high scratch resistance. Their stability can be further increased by the addition of further organosilanes, in particular amino-substituted organosilicon compounds. However, when these silicone elastomers are exclusively used in preparing offset plates for waterless printing, the developability and the resolution attainable are reduced.

After application in the form of a layer the silicone elastomer of the inner layer is crosslinked in a known manner by the action of moisture or by itself at room temperature or elevated temperature to give a silicone rubber essentially insoluble in organic solvents. The finished silicone rubber layer has in general a thickness ranging from about 0.1 to 10 $\mu$m, preferably from about 0.4 to 5 $\mu$m. The coating is applied, in general, from non-polar solvents, for example paraffin hydrocarbons that only slightly dissolve the light-sensitive layer underneath, or not at all.

To remove the solvent, the coating is then dried at an elevated temperature and, in the process, the elastomer is at least partially crosslinked. A solution of the elastomer for the outer layer in an organic solvent is then applied to the layer obtained and is crosslinked to form an essentially insoluble silicone rubber layer which firmly adheres to the inner silicone layer. The outer silicone rubber layer has in general a thickness ranging from about 0.2 to 10 $\mu$m, preferably from about 0.5 to 5 $\mu$m.

The condensation-crosslinkable silicone elastomers that are preferably used for the outer layer result in printing plates having non-image areas with a lower tendency to scumming than the non-image areas of printing plates prepared, for example, with single-component silicone elastomers. Above all, they have a high scratch resistance.

As is known per se, the light-sensitive layer lies underneath the silicone rubber layers. Light-sensitive substances which can be used include both positive-working systems (i.e., that are rendered soluble by exposure) and negative-working systems (i.e., that are light-hardenable).

Suitable positive layers that, as a result of the image reversal caused by waterless offset printing, give plates that print negatively comprise the known light-sensitive compositions based on 1,2-quinonediazides or on compounds which can be split by acid. 1,2-Quinonediazides are known and are, for example, described in German Patents No. 938 233 and No. 15 43 721 and in German Offenlegungsschriften No. 23 31 377, No. 25 47 905 and No. 28 28 037. 1,2-Quinonediazides that are preferably employed include the esters and amides of 1,2-naphthoquinone-2-diazide-4-sulfonic acid and 1,2-naphthoquinone-2-diazide-5-sulfonic acid. Among these, special preference is given to the esters, particularly to those of the 5-sulfonic acid. The added amount of 1,2-quinonediazide compounds generally varies between about 3% and 50% by weight, preferably between about 7% and 35% by weight, relative to the weight of the non-volatile layer constituents. Further constituents of the layer above all include water-insoluble binders which are soluble in aqueous-alkaline solutions.

Suitable alkali-soluble or alkali-swellable binders include synthetic resins, such as copolymers of styrene and maleic anhydride, and, in particular, novolacs. The amount of the alkali-soluble resins, based on total solids, ranges between about 30% and 90% by weight, particularly preferably between about 55% and 85% by weight. Phenolic resins of the poly(4-vinylphenol) type can also be used to advantage instead of the novolacs or in admixture with novolacs. Additionally, other resins may be used which are alkali-insoluble or are water-soluble. Advantageously, the proportion of these resins in general does not exceed about 20% of the alkali-soluble resin. The photosensitive layer can also contain small amounts of other substances, such as polyglycols, cellulose derivatives, such as ethyl cellulose, surfactants, dyes and fine-particulate pigments, and UV absorbers, if required.

Other suitable positive-working layers comprise combinations of compounds which form a strong acid upon exposure and compounds containing at least one acid-cleavable C—O—C bond.

The layer can contain, as compounds having acid-cleavable C—O—C bonds, inter alia, monomeric and polymeric acetals, monomeric and polymeric orthocarboxylic acid esters, enol-ethers and N-acyliminocarbonates. Mixtures of this type are described in German Patents 26 10 842 and 27 18 254, in European Patent No. 22 571 and in European Patent Applications Nos. 6 626 and 6 627. Polymeric acetals and orthocarboxylic acid esters are particularly preferred. The proportion of acid-cleavable compound generally ranges from about 2% to 75% by weight, preferably from about 4% to 30% by weight, based on the non-volatile constituents of the layer.

A large number of known compounds and mixtures are suitable for use as radiation-sensitive components which on irradiation form or eliminate preferentially strong acids, such as diazonium, phosphonium, sulfonium and iodonium salts, halogen compounds, o-quinonediazide sulfochlorides and organometal/organohalogen combinations. In principle it is possible to use as halogen-containing radiation-sensitive compounds which form hydrohalogenic acid any organic halogen compounds which are also known as a photochemical free-radical starter, for example, those having more than one halogen atom on a carbon atom or in an aromatic ring. Examples have been described in U.S. Pat. Nos. 3,515,552; 3,536,489 and 3,779,778, German Auslegeschrift 26 10 842 and German Offenlegungsschriften 27 18 259 and 22 43 621.

The amount of the starter can also vary widely depending on the chemical nature of the starter and the composition of the mixture. Favorable results are obtained using about 0.1% to 10% by weight, based on total solids, with about 0.2% to 5% being preferable.

The mixtures also contain polymeric binders, such as those described above for quinonediazide layers. The positive-working light-sensitive layer generally has a weight from about 0.3 to 3 g/m$^2$, layer weights ranging from about 0.8 to 1.8 g/m$^2$ being preferred in most cases.

Suitable negative-working layers include, inter alia, layers of photopolymerizable mixtures, photocrosslinkable polymers, diazonium salt polycondensation products and azido compounds.

Suitable photopolymerizable mixtures contain a polymerizable compound having at least two terminal, ethylenically-unsaturated double bonds, a polymeric binder and a photoinitiator which is capable of initiating the free-radical polymerization of the ethylenically-unsaturated compound under the action of actinic radiation. Furthermore, the layer can contain stabilizers or inhibitors to prevent dark polymerization of the monomers, hydrogen donors, surfactants, plasticizers, sensitometric regulators, dyes and colored or uncolored pigments.

The photoinitiators are generally employed in amounts of about 0.01% to 10.0% by weight, preferably of about 0.2% to 5.0% by weight, based on the non-volatile constituents of the photopolymerizable layer.

Photopolymerizable monomers useful for the purposes of this invention are known and are, for example, described in U.S. Pat. Nos. 2,760,863 and 3,060,023. Preferred examples are acrylic and methacrylic acid esters, such as polyethylene glycol dimethacrylate, acrylates and methacrylates of trimethylol ethane, trimethylol propane, pentaerythritol and of polyhydric alicyclic alcohols. The proportion of monomers contained in the layer in general varies between about 10% and 80% by weight, preferably between about 20% and 60% by weight, on the above basis.

Examples of suitable binders are acrylic resins, polyvinyl acetals, polyvinyl esters, maleate resins, polymers of $\beta$-methacryloyloxy-ethyl-N-(p-tolyl-sulfonyl)-carbamate and copolymers of these and similar monomers with other monomers, and also styrene/maleic anhydride copolymers, copolymers of methylmethacrylate and methacrylic acid and copolymers of methacrylic acid, alkyl methacrylates and methyl methacrylate and/or styrene, acrylonitrile, and the like. In general, the added quantity of binder amounts to about 20% to 90%, preferably about 40% to 80%, by weight.

Condensation products of aromatic diazonium salts which are capable of condensation, such as, for example, diphenylamine-4-diazonium salts, with aldehydes, preferably formaldehyde, can be employed as diazonium salt polycondensation products. It is particularly advantageous to use mixed condensation products which, apart from the diazonium salt units, contain other, non-photosensitive units derived from compounds capable of condensation, in particular from aromatic amines, phenols, phenolic ethers, aromatic thioethers, aromatic hydrocarbons, aromatic heterocyclic compounds and organic acid amides. These condensation products are described in U.S. Pat. No. 3,867,147. Generally, all diazonium salt polycondensation products described in U.S. Pat. No. 4,186,017 are suitable.

The photosensitive layers based on diazonium salt condensation products may also contain binders, dyes, indicators, pigments, stabilizers, surfactants and other customary additives. Water-insoluble resinous binders are advantageously employed, in particular in combination with the preferred mixed condensation products of diazonium salts. Examples of suitable binders include polyalkylacrylates, polyvinylacetals and reaction products of dicarboxylic acid anhydrides, for examples, maleic or phthalic acid anhydride, with polymers containing OH groups, for example, polyvinyl acetals, polyvinyl alcohols or partially saponified polyvinyl acetates. Binders of this kind are described in European Patent Application No. 152 819.

The light-sensitive layers based on diazonium salt condensation products contain in general about 5% to 90% by weight, preferably about 10% to 70% by weight, of diazonium compound and about 95% to 10% by weight, preferably about 90% to 30% by weight, of polymeric binder.

To stabilize this light-sensitive layer, it is advantageous to add to the latter a compound of acidic character. These can be mineral acids and strong organic acids, amongst which phosphoric acid, sulfuric acid, perchloric acid, boric acid or p-toluenesulfonic acid are preferred. Phosphoric acid is particularly suitable.

Moreover, polyvinyl cinnamates, chalcone derivatives and aromatic azides are suitable as photocrosslinkable compounds.

The negative-working photosensitive layer generally has a weight of about 0.3 to 10 g/m$^2$, layer weights between about 0.8 to 3 g/m$^2$ being preferred in most cases.

The support materials used are in most cases metals. Suitable supports include mill-finished, mechanically or electrochemically grained and, if appropriate, anodized aluminum which, in addition, may also have been pretreated chemically, for example, with a polyvinylphosphonic acid, silicates, phosphates, hexafluorozirconates or with hydrolyzed tetraethyl orthosilicate. Other suitable metals are steel and chromium. Since, in contrast to conventional lithographic printing plates, it is not necessary for the support surface to be hydrophilic, it is also possible with advantage to use copper, brass or other oleophilic metals as the support surface. Likewise, plastic sheets, such as polyester, polycarbonate, polyimide or cellulose acetate sheets, can also be used, the surface of which may have been pretreated, if necessary, for improving the wettability by printing ink. Rubber-elastic support materials are also suitable; such supports also allow printing in direct planographic printing.

In the case of the printing forms prepared from the material according to the invention, the support material serves as the ink-receptive material, in contrast to the otherwise usual printing forms. The silicone rubber layer which remains in place after exposure and development serves as the image background and, in the dry state, has an ink-repellent action. For printing, both conventional oil-based printing inks and special hydrophilic printing inks, such as have been developed for waterless offset printing and reverse offset printing and are commercially available, can be used. Since most of the usual support surfaces, for example grained or anodically oxidized aluminum, are highly hydrophilic, hydrophilic printing inks are used with advantage.

For developing the exposed printing plates, mixtures of organic solvents with one another or with water are preferably used. In this case, one constituent is chosen that is able to swell the silicone rubber layers, and one constituent is chosen that selectively dissolves the exposed light-sensitive layer. Examples of suitable developers are combinations of paraffin hydrocarbons with polar solvents, such as esters, ketones or alcohols. Combinations of water-miscible solvents, such as lower alcohols or ketones, and water are also suitable.

Examples of preferred embodiments of the invention are described below. Unless otherwise stated, the quantitative ratios and percentages relate to weight. Before the illustrative examples, the silicone elastomer solutions used are described.

Silicone elastomer solutions used (A) A commercially available 60% solution of a single-component silicone elastomer, crosslinkable at room temperature by the action of moisture, in toluene (viscosity about 350 mPa.s at 23° C.) was diluted in a ratio of 1:4 with an isoparaffin mixture of boiling range 116°–136° C. under normal pressure (Isopar E).

(B) 84 parts by weight of a 50% solution of the reaction product of 1.99 parts by weight of a dimethylpolysiloxane having terminal OH groups (OH group content 3.5%) and 1 part by weight of 3-(2-amino-ethylamino)-propyltrimethoxysilane were added to a solution of 5 parts by weight of a dimethyl-polysiloxane having terminal OH groups bonded to silicon and a Brabender plasticity of 5.8 kNm and 0.3 part by weight of a solution of a methylhydrogenpolysiloxane having terminal trimethylsiloxy groups and a viscosity of 0.4 cm$^2$/s at 25° C. in 9.7 parts by weight of toluene. 0.3 part by weight of dibutyl-tin diacetate was then added, and the whole was mixed. 0.4 part by weight of aminopropyl-trimethoxysilane was added to this solution and mixed with it.

(C) 10 parts by weight of a dimethylpolysiloxane having terminal vinyldimethylsiloxane units and a viscosity of 7000 mPa.s at 25° C. were mixed with 0.025 part by weight of 2-methyl-3-butyn-2-ol, 0.03 part by weight of the mixture, described below, of the platinum complex of vinylsiloxane and a diluent, 0.09 part by weight of a copolymer of 4 mol % of trimethylsiloxane units, 72 mol % of methylhydrogensiloxane units and 24 mol % of dimethylsiloxane units, having a viscosity of 50 mPa.s at 25° C. and an Si-bonded hydrogen content of 1.36% and with 88.9 parts by weight of Isopar E. The mixture can be processed within a period of up to 24 hours after the preparation.

The platinum complex mixture was prepared as follows: 20 parts by weight of sodium bicarbonate were added to a mixture of 10 parts by weight of $H_2PtCl_6 \times 6H_2O$, 20 parts by weight of 1,3-divinyl1,1,3,3-tetramethyl-disiloxane and 50 parts by weight of ethanol. The mixture was heated to the boil under reflux for 30 minutes with stirring, then left to stand for 15 hours and afterwards filtered. The volatile constituents were distilled off from the filtrate under 16 mbar. As the residue, 17 parts by weight of a liquid were obtained which was dissolved in benzene. The solution was filtered and the benzene was distilled off from the filtrate. The residue was mixed with a dimethylpolysiloxane, having terminal vinyldimethylsiloxane units and a viscosity of 1.4 Pa.s at 23° C., as a diluent in such a quantity that the mixture contained 1% by weight of platinum, calculated as the element.

Example 1

3 pbw of the diazonium salt condensation product of 1 mol of 3-methoxy-diphenylamine-4-diazonium salt and 1 mol of 4,4'-bis-methoxymethyl-diphenylether, isolated as the mesitylene sulfonate, 3 pbw of the reaction product of 50 parts by weight of a polyvinylbutyral having a molecular weight of 70,000 to 80,000 and containing 71% of vinylbutyral units, 2% of vinylacetate units and 27% of vinyl alcohol units with 4 parts by weight of maleic anhydride, 0.05 pbw of $H_3PO_4$ (85%) and 0.02 pbw of phenylazodiphenylamine in 93.93 pbw of 2-methoxy-ethanol, was applied to an electrolytically grained and anodically oxidized aluminum sheet and dried. The layer applied had a weight of 1 g/m$^2$. Outer layers comprising silicone elastomer A were applied to samples prepared from the sheet and were dried for 10 minutes at 100° C. to effect crosslinking and stored for 24 hours.

The silicone rubber layers had the following layer weights:
(a) 3 g/m²
(b) 2.1 g/m²
(c) 0.9 g/m²

Sample plates (b) and (c) were coated with solution B and dried for 3 minutes at 110° C. The layer weights of the layers obtained were 0.9 g/m² for (b) and 2.1 g/m² for (c). Plate (a) was used as a reference.

Each plate so prepared was exposed under an original for 50, 70 and 90 seconds, using a metal halide lamp (5 kW). The original was a continuous-tone step wedge comprising 12 density steps with increments of 0.15 each, starting at density 0.15 in step 1.

For the resolution test a 150 dot screen halftone step wedge was used with the following percentages of black areas:

1%, 2%, 3%, 4%, 5%, 95%, 96%, 97%, 98%, 99%

The exposed plates were treated for 6 minutes in a developer solution using an oscillating felt (stroke 4.8 mm, frequency of oscillation 3000/min, contact pressure 1500 N/m²). The developer solution had the following composition:
- 40 pbw of an isoparaffin mixture having a boiling range from 176° to 188° C.,
- 27 pbw of tripropylene glycol,
- 30 pbw of diethylene glycol dimethyl ether The plates were rinsed with water and inked. The results are given in Table II.

Example 2 (Comparison Example)

An aluminum sheet was coated with a light-sensitive layer as described in Example 1. In this case, a silicone elastomer layer was applied to the plate from solution B and dried for 3 minutes at 110° C. The outer layer had a layer weight of 3.5 g/m².

The plate was exposed, developed and inked as described in Example 1. The result obtained is indicated in Table II.

Another sample of the plate was used for printing on a commercial offset-printing machine (Heidelberger KOR), using a commercial ink for waterless offset printing and removing the damping unit. After 70,000 impressions the 95% dots were no longer reproduced; the test was stopped. The plate surface did not show any scratches.

Example 3

An aluminum sheet was coated with a light-sensitive layer as described in Example 1. A silicone elastomer layer was applied to the plate, using solution C which was dried for 3 minutes at 110° C. and crosslinked. Six different plates were prepared, in which the silicone layers had the following weights:
(a) 3 g/m²
(b) 0.8 g/m²
(c) 3.5 g/m²
(d) 2 g/m²
(e) 1 g/m²
(f) 1.6 g/m²

Solution B was used to apply layers of different thicknesses to the dried silicone elastomer layers of plates b, d, e and f; these outer layers were dried for 3 minutes at 110° C. The silicone rubber layers had the following layer weights in g/m²:

|   | inner layer (C) | outer layer (B) |
|---|---|---|
| b | 0.8 | 2.8 |
| d | 2 | 1 |
| e | 1 | 2 |
| f | 1.6 | 1.6 |

The plates were exposed, developed and inked as described in Example 1. The results are given in Table II.

Three of the above-described plates were used for printing as described in Example 2 on the

TABLE I

| Plate | Inner Layer (C) (g/m²) | Outer Layer (B) (g/m²) | Print Run | Scratches |
|---|---|---|---|---|
| c (Co) | 3.5 | — | 110,000 | slight scratches from 35,000 impressions |
| b | 0.8 | 2.8 | 195,000 | no scratches |
| f | 1.6 | 1.6 | more than 135,000 | slight scratches from 120,000 impressions |

TABLE II

| Example | Plate | Silicone Rubber Layer Inner Layer | Silicone Rubber Layer Outer Layer | Wedge Step 50s | Wedge Step 70s | Wedge Step 90s | Resolution, % points in 150 dot screen 50s | 70s | 90s |
|---|---|---|---|---|---|---|---|---|---|
| 1 | a (Co) | 3 g/m² (A) | — | 3 | 4 | 4-5 plate scratched | 98/2 | 98/2 | 98/2 |
| 1 | b | 2.1 g/m² (A) | 0.9 g/m² (B) | 5 | 6 | 7 | 99/2 | 99/3 | 99/4 |
| 1 | c | 0.9 g/m² (A) | 2.1 g/m² (B) | 6 | 7 | 8 | 99/3 | 99/4 | 99/5 |
| 2 | (Co) | 3.5 g/m² (B) | — | plate insufficiently developed after 6 minutes | | | 99/10 | (after 10 minutes development) | |
| 3 | a (Co) | 3 g/m² (C) | — | 4 | 5 | 5-6 | 99/2 | 99/2 | 99/3 |
| 3 | b | 0.8 g/m² (C) | 2.8 g/m² (B) | 4 | 5 | 6 | 98/2 | 98/3 | 98/4 |
| 3 | c (Co) | 3.5 g/m² (C) | — | 4 | 5 | 6 | 99/3 | 99/5 | 99/5 |
| 3 | d | 2 g/m² (C) | 1 g/m² (B) | 5 | 6 | 7 | 99/2 | 99/4 | 99/4 |
| 3 | e | 1 g/m² (C) | 2 g/m² (B) | 6 | 7 | 8 | 99/3 | 99/5 | 99/5 |
| 3 | f | 1.6 g/m² (C) | 1.6 g/m² (B) | 6 | — | — | 99/3 | — | — |

Co = Comparison Test

Example 4

A solution of
- 2.3 pbw of polyethylene glycol-400-dimethacrylate,
- 1.9 pbw of the polymeric reaction product specified in Example 1,
- 0.21 pbw of 2-(4-ethoxy-naphth-1-yl)-4,6-bis-trichloromethyl-s-triazine,
- 0.02 pbw of phenylazodiphenylamine and 0.05 pbw of phosphoric acid (85%) in
95.52 pbw of 2-methoxy-ethanol
was applied to an electrolytically grained and anodically oxidized aluminum sheet and dried. The weight of the layer applied was 1.4 g/m². This plate was coated with a layer of the silicone elastomer C and dried for 3 minutes at 110° C. The layer weight was 1 g/m². On top of this layer, a layer of the silicone elastomer B was then applied and also dried for 3 minutes at 110° C. (layer weight 2 g/m²). The plate was exposed and developed as described in Example 1 and yielded a printing form showing high resolution and scratch resistance.

Example 5

A filtered solution of
1.8 pbw of the naphthoquinone diazide sulfonic acid ester described below,
0.22 pbw of naphthoquinone-(1,2)-diazide-(2)-4-sulfonyl chloride,
0.07 pbw of 2,3,4-trihydroxy-benzophenone,
6.6 pbw of a cresol-formaldehyde novolac having a melting range from 105° to 120° C., according to DIN 53 181 and
0.08 pbw of crystal violet in
91.22 pbw of a mixture of 5 parts by volume of tetrahydrofuran, 4 parts by volume of ethylene glycol monomethyl ether and 1 part by volume of butyl acetate
was applied to an aluminum sheet which had been roughened by brushing and dried.

The naphthoquinone diazide sulfonic acid ester used in the above formula was prepared as follows:

A solution of 25.5 parts by weight of naphthoquinone(1,2)-diazide-(2)-5-sulfonic acid chloride in 442 parts by weight of acetone was clarified over active carbon. 26.3 parts by weight of the above-indicated cresol-formaldehyde novolac and 4.4 parts by weight of 2,3,4-trihydroxybenzophenone were dissolved in the solution and the whole was admixed with a solution of 11.9 parts by weight of $NaHCO_3$ in 124 parts by weight of water and with 160 parts by weight of a saturated sodium chloride solution. The mixture was stirred for 10 minutes and allowed to deposit, the lower phase was rejected and the acetone solution was allowed to flow into a solution of 6 parts by weight of HCl (30%) and 1500 parts by weight of water, within a few minutes. The separated yellow, flaky reaction product was sucked off, washed with water and dried. The yield was 48 parts by weight.

The light-sensitive material obtained was spin-coated with the following solution:
95.2 pbw of demineralized water,
4.8 pbw of a 30% strength anionic silica sol having an $Na_2O$ content of about 0.15% and a particle size of 25 to 30 nm,
0.04 pbw of nonylphenolpolyglycol ether.

In the process, the spin-coater rotated at a speed of about 175 rpm. The layer was dried with warm air and then solution B was applied at a spin-speed of about 110 rpm and dried for 3 minutes at 110° C. The layer weight was 1 g/m². Solution C was applied to this layer and dried for 3 minutes at 110° C.

The plates were exposed and developed as described in Example 1. A turbid mixture saturated with sodium metasilicate, of 90 parts by volume of water, 9 parts by volume of isopropanol and 1 part by volume of an aliphatic hydrocarbon mixture having a boiling range from 116° to 142° C. served as the developer.

The printing form obtained produced clean impressions and showed an extremely scratch-resistant surface.

What is claimed is:

1. A light-sensitive printing plate for waterless planographic printing, comprising:
    a support;
    a superimposed light-sensitive layer selected from the group consisting of a light sensitive layer which becomes soluble in developer upon exposure to light and a light-hardenable layer which becomes insoluble in a developer upon exposure to light; and 2. A light-sensitive printing plate as claimed in claim 1, wherein the condensation-crosslinked multicomponent silicone elastomer comprises the reaction product of a combination of
    (a) a diorganopolysiloxane having terminal Si-OH groups,
    (b) an organopolysiloxane containing hydrogen atoms bonded to silicon and having no amino groups,
    (c) an amino-substituted organo-silicon compound and
    (d) a catalytically acting organo-tin compound.

3. A light-sensitive printing plate as claimed in claim 1, wherein the addition-crosslinked multicomponent silicone elastomer comprises the reaction product of a combination of
    (a) a diorganopolysiloxane having terminal Si-vinyl groups,
    (b) an organopolysiloxane having at least three hydrogen atoms bonded to silicon,
    (c) a platinum complex of a vinyl siloxane and
    (c) an agent which retards the addition of hydrogen atoms bonded to silicon to aliphatic multiple bonds at room temperature.

4. A light-sensitive printing plate as claimed in claim 1, wherein the outer silicone rubber layer has a layer thickness ranging from about 0.2 to 10 μm.

5. A light-sensitive printing plate as claimed in claim 1, wherein the inner silicone rubber layer has a layer thickness ranging from about 0.1 to 10 μm.

6. A light-sensitive printing plate as claimed in claim 1, wherein the light-sensitive layer comprises a diazonium salt polycondensation product.

7. A light-sensitive printing plate as claimed in claim 1, wherein the outer silicone rubber layer comprises a condensation-crosslinked multi-component silicone elastomer, and the inner silicone rubber layer comprises an addition-crosslinked multi-component silicone elastomer.

8. A light-sensitive printing plate as claimed in claim 7, wherein the light-sensitive layer comprises a light-hardenable layer.

9. A light-sensitive printing plate as claimed in claim 7, wherein the light-sensitive layer comprises a diazonium salt polycondensation product.

10. A light-sensitive printing plate as claimed in claim 1, wherein the outer silicone rubber layer comprises a condensation-crosslinked multi-component silicone elastomer, and the inner silicone rubber layer comprises a crosslinked single-component silicone elastomer.

11. A light-sensitive printing plate as claimed in claim 10, wherein the light-sensitive layer comprises a diazonium salt polycondensation product.

* * * * *

UNITED STATES PATENT AND TRADEMARK OFFICE
CERTIFICATE OF CORRECTION

PATENT NO. : 4,937,169

DATED : June 26, 1990

INVENTOR(S) : Hans-Joachim SCHLOSSER

It is certified that error appears in the above-identified patent and that said Letters Patent is hereby corrected as shown below:

Column 12:

Claim 1, line 8, after "and" insert
　　　--an ink-repellent silicone rubber layer overlying the
　　　light-sensitive layer comprising an inner layer and an outer
　　　layer, the outer layer having a higher degree of
　　　crosslinking than the inner layer, the outer silicone rubber
　　　layer comprising a condensation-crosslinked multi-component
　　　silicone elastomer and the inner silicone rubber layer
　　　comprising an addition-crosslinked multi-component silicone
　　　elastomer or a crosslinked single-component silicone
　　　elastomer.--.

Signed and Sealed this

Sixth Day of July, 1993

Attest:

MICHAEL K. KIRK

Attesting Officer　　　Acting Commissioner of Patents and Trademarks